(12) United States Patent
Tsuchida et al.

(10) Patent No.: US 7,651,783 B2
(45) Date of Patent: Jan. 26, 2010

(54) SURFACE TREATED COPPER FILM

(75) Inventors: Katsuyuki Tsuchida, Kitaibaraki (JP);
Masashi Kumagai, Hitachi (JP);
Fumiaki Akase, Hitachi (JP)

(73) Assignee: Nikko Materials Co., Ltd., Tokyo (JP)

( * ) Notice: Subject to any disclaimer, the term of this patent is extended or adjusted under 35 U.S.C. 154(b) by 22 days.

(21) Appl. No.: 10/486,274

(22) PCT Filed: Jul. 17, 2002

(86) PCT No.: PCT/JP02/07257
§ 371 (c)(1),
(2), (4) Date: Feb. 5, 2004

(87) PCT Pub. No.: WO03/038149
PCT Pub. Date: May 8, 2003

(65) Prior Publication Data
US 2004/0209109 A1      Oct. 21, 2004

(30) Foreign Application Priority Data

Oct. 30, 2001   (JP) .............................. 2001-332233
Jun. 12, 2002   (JP) .............................. 2002-170827

(51) Int. Cl.
H05K 1/03      (2006.01)
H05K 3/38      (2006.01)
H05K 3/46      (2006.01)
B32B 15/08     (2006.01)

(52) U.S. Cl. ........................ 428/626; 428/671; 428/674; 428/658; 428/687; 428/447

(58) Field of Classification Search ................ 428/606, 428/607, 624, 666, 658, 674, 671, 687, 446, 428/447, 448, 450, 457, 469
See application file for complete search history.

(56) References Cited

U.S. PATENT DOCUMENTS

| | | | |
|---|---|---|---|
| 4,990,397 A * | 2/1991 | Tsunemi et al. ............. 442/251 |
| 5,061,550 A | 10/1991 | Shimizu et al. |
| 6,475,638 B1 * | 11/2002 | Mitsuhashi et al. ......... 428/606 |
| 6,506,314 B1 * | 1/2003 | Whitney et al. ............. 216/100 |
| 6,558,783 B1 * | 5/2003 | Kato et al. ............... 428/297.4 |
| 6,605,369 B1 * | 8/2003 | Takahashi et al. .......... 428/623 |

FOREIGN PATENT DOCUMENTS

| | | |
|---|---|---|
| EP | 0 678 596 | 10/1995 |
| FR | 2 716 329 | 8/1995 |
| JP | 58-056758 | 12/1983 |
| JP | 59 020621 | 2/1984 |
| JP | 61-033907 | 8/1986 |
| JP | 02-307294 | * 12/1990 |
| JP | 2-307294 | 12/1990 |
| JP | 5 029740 | 2/1993 |
| JP | 05-029740 | * 2/1993 |
| JP | 06-081157 | * 3/1994 |
| JP | 06-085416 | 3/1994 |
| JP | 6-283030 | 10/1994 |
| JP | 07-032307 | 4/1995 |
| JP | 7 302968 | 11/1995 |
| JP | 8 088461 | 4/1996 |
| JP | 08-222857 | 8/1996 |
| JP | 08-511654 | 12/1996 |
| JP | 10-317159 | 12/1998 |
| JP | 11-262975 | * 9/1999 |
| JP | 11-354901 | * 12/1999 |
| JP | 2000-313963 | 11/2000 |
| JP | 2000-349437 | 12/2000 |
| JP | 2001-217553 | 8/2001 |
| JP | 2001-284821 | 10/2001 |
| JP | 2003-501813 | 1/2003 |
| WO | WO 94/21097 | 9/1994 |
| WO | WO 9942523 | * 8/1999 |
| WO | WO 01/19606 A1 | 3/2001 |
| WO | 01/45475 | 6/2001 |
| WO | WO 01/45475 | * 6/2001 |
| WO | 01/56345 | 8/2001 |

OTHER PUBLICATIONS

European Patent Office Search Report dated May 26, 2006 (5 pages).

* cited by examiner

*Primary Examiner*—John J. Zimmerman
*Assistant Examiner*—Aaron Austin
(74) *Attorney, Agent, or Firm*—Flynn, Thiel, Boutell & Tanis, P.C.

(57) ABSTRACT

A surface treated copper foil with improved adhesion to the insulating resin of a copper-clad laminate for higher frequency applications contains a copper foil provided with a heat-resistant layer and an olefin-based silane coupling agent layer sequentially on at least one side thereof. An anticorrosive treatment may be performed after the heat resistance treatment. The copper foil is preferably an electrolytic copper foil, and these layers can be provided on the S side and/or the M side thereof. The copper foil has an adequate adhesive strength, even without the roughening treatment that has been performed in the past. A film of zinc, zinc-tin, zinc-nickel, zinc-cobalt, copper-zinc, copper-nickel-cobalt, or nickel-cobalt can be used favorably as the heat-resistant layer, and a film that has undergone a zinc-chromate or a chromate treatment can be used favorably as the anticorrosive layer.

5 Claims, No Drawings

SURFACE TREATED COPPER FILM

TECHNICAL FIELD

This invention relates to a low-profile copper foil with excellent adhesion to the insulating resin used for a copper-clad laminate for higher frequency applications.

BACKGROUND ART

As the performance and functions of computers and communication devices have improved and become increasingly network-oriented in recent years, signals trend toward higher frequencies used for the high-speed transmission of large volumes of information.

Printed wiring boards are used in these communication devices. A printed wiring board is usually produced by first producing a copper-clad laminate by heating and pressing a substrate made of a resin or other insulating material and a copper foil that serves as the conductive part, then etching to form a circuit. The process is completed by mounting semiconductor elements or the like on this circuit.

Copper foils include rolled copper foil and electrolytic copper foil, and the surface treatment method differs with the type of foil used. However, the majority of the copper foil used in printed wiring boards is electrolytic copper foil because of its good adhesive strength with insulating substrates. An electrolytic copper foil is formed by casting an electrolyte composed of a sulfuric acid acidic copper sulfate solution between the drum of a cathode made of titanium or the like, and an anode disposed across from this cathode, and electrodepositing copper onto the drum. The copper foil is formed by passing a current between the revolving drum (cathode) and the anode and continuously peeling away the copper foil (called a "raw" foil) that has been electrodeposited in a specific thickness on the drum surface. The drum side of the electrolytic copper foil is relatively smooth and is called the S side (the shiny side), while the other side has more surface roughness and is called the M side (the matte side).

Because of their excellent adhesion characteristics, epoxy resins have been used fairly widely for the insulating materials of printed wiring boards. However, epoxy resins generally have a high dielectric constant or dielectric tangent and thus unsatisfactory high frequency characteristics. A resin with excellent dielectric characteristics has to be used, but resins with a low dielectric constant or dielectric tangent tend to exhibit poor adhesion characteristics, owing to having only a few functional groups with a high polarity that contribute to adhesion. Also, the copper foil of a copper-clad laminate for higher frequency applications preferably has as little surface roughness as possible. The reason this lower profile is preferable for the copper foil is theorized that current flow becomes concentrated in the surface of the copper foil as the frequency rises (this is called the skin effect), meaning that the surface roughness of a copper foil greatly affects transmission loss.

One of the most important characteristics required of a copper foil is its adhesion to the insulating resin that makes up the printed wiring board. To improve this characteristic, with an electrolytic copper foil, large undulations are generally provided to the M side at the raw foil stage, and roughening particles are provided on the M side in treatment working, thereby, the adhesive strength is enhanced through a mechanical effect (anchor effect). The roughening particles used in the roughening treatment come in all different sizes, but are usually nodule- or needle-shaped particles made of copper or copper oxide and measuring about 0.2 to 3 μm in overall length. However, as mentioned above, the patterns of printed wiring have been made increasingly finer in recent years, so there is a need for a copper foil of lower profile. This requirement has been dealt with in the past, for example, by reducing the size of the undulations of the copper foil at the raw foil stage, or by changing the shape of the roughening particles (making them finer).

Standard means employed to improve the adhesion of a copper foil with an insulating resin are the surface treatment of a copper foil with a silane coupling agent, or the addition of a silane coupling agent to the resin. While the undulations of the copper foil tend to be made as small as possible in the manufacture of a copper foil for a copper-clad laminate for higher frequency applications as above, after the roughening particles have been applied, an anticorrosive treatment and silane coupling agent treatment are currently performed. Nevertheless, since these roughening particles increase the surface roughness and surface area of a copper foil, they are considered to have an adverse effect on transmission characteristics.

In the case of a copper foil for a multi-layer printed circuit inner layer, the following approach has also been taken. After depositing roughening particles on the M side, this side of a copper foil used for an inner layer of a multi-layer board is generally subjected to an anticorrosive treatment and a silane coupling agent treatment. Next, the foil is put together with the inner layer substrate, and then a circuit is etched. Furthermore, the S side of the copper foil is subjected to a black oxide treatment, after which the outermost layer is stuck. However, not only managing the liquid in the black oxide treatment is difficult, but insulation characteristics and interlayer connection reliability tend to suffer because of frequent haloing at the subsequent through-hole production stage. Furthermore, chemical reduction treatments have been performed in an effort to prevent the haloing, but this drives up the cost. The use of a copper foil treated on both sides (double-treated foil) has also been discussed in Japanese Patent Publication H8-222857 as another option. With this method, though, not only are more copper foil manufacturing steps entailed, but the S side of the copper foil is the side on which etching is commenced, because the M side of the double-treated foil is used as the side to which the inner layer substrate is bonded. Accordingly, the etching factor is not very high, and it is difficult to accommodate fine, high-density circuits. Another recent technique is to provide roughening particles to the S side of a copper foil, and apply the inner layer substrate to the S side, as discussed in Japanese Patent Publication H8-511654.

DISCLOSURE OF THE INVENTION

With a copper-clad laminate for higher frequency applications or a multi-layer printed circuit inner layer substrate for higher frequency applications, the adhesive strength between the copper foil and the insulating resin decreases due to changing the resin and lowering the profile of the copper foil. Therefore, there is a pressing need to improve this adhesion.

The prior art discussed above always involves a roughening treatment in which roughening particles are applied to the copper foil. However, these roughening particles are deposited by plating in which a metal is formed into a nodule or needle shape, for the reason, the current density has to be set higher, which drives up the manufacturing cost. Moreover, the roughening particles may remain behind in the patterning of a circuit by etching, and this is disadvantageous in terms of forming fine lines. Accordingly, an increase in adhesive strength is demanded by an alternative to these roughening treatments, more specifically, by a chemical treatment.

As mentioned above, the usual way of improving the adhesion between a copper foil and an insulating resin involves surface treatment with a silane coupling agent or the addition of such an agent to a resin. Commercially available epoxy-based and amino-based silane coupling agents are effective, and have been in use for many years. However, the required characteristics cannot be achieved in the case of the above-mentioned higher frequency applications of today.

In view of this, it is an object of the present invention to provide a copper foil with an improved adhesion to insulating resins in a copper-clad laminate for higher frequency applications and a multilayer printed circuit inner layer substrate for these applications, capable of meeting the requirements of the applications.

As a result of diligent research aimed at improving the adhesion between a copper foil and an insulating resin, the inventors discovered that excellent adhesion to the insulating resins of a copper-clad laminate for higher frequency applications can be obtained by the combination of suitable surface treatments to apply to at least one side of a copper foil. Specifically, the present invention is the following (1) to (8)

(1) A surface treated copper foil, comprising a copper foil sequentially provided a heat-resistant layer, an anticorrosive layer and an olefin-based silane coupling agent layer on at least one side thereof.

(3) The surface treated copper foil according to (1), wherein the copper foil is an electrolytic copper foil, and the heat-resistant layer and olefin-based silane coupling agent layer are provided on an M side and/or S side thereof.

(4) The surface treated copper foil according to (3), wherein the heat-resistant layer is at least one film selected from a group consisting of zinc, zinc-tin, zinc-nickel, zinc-cobalt, copper-zinc, copper-nickel-cobalt and nickel-cobalt, and the anticorrosive layer is a film formed by a zinc-chromate or a chromate treatment.

(5) The surface treated copper foil according to any of (1), (3) and (4), wherein a siloxane coating is further formed over the heat-resistant layer or the anticorrosive layer, and the olefin-based silane coupling agent layer is provided over the siloxane coating.

(6) The surface treated copper foil according to any of (1), (3) to (5), wherein a surface roughness of the copper foil is no more than 3.5 μm.

(7) A copper-clad laminate for higher frequency applications that makes use of the copper foils according to any of (1), (3) to (6).

(8) A copper-clad laminate for higher frequency applications in which the copper foil according to any of (1), (3) to (6) is used for a multi-layer printed circuit inner layer.

The mechanism by which adhesion is improved with the copper foil of the present invention is theorized as follows: the heat-resistant layer prevents the copper from inhibiting resin curing; furthermore, the specified silane coupling agent chemically bonds with the copper foil and resin to increase adhesive strength. Research on the part of the inventors has confirmed that the increase in adhesive strength and anticorrosion are inadequate with a copper foil that has been covered with just the heat-resistant layer or the olefin-based silane coupling agent layer alone, but that good results, particularly with increasing adhesion, are obtained with this combination.

The constitution of the present invention will now be described in detail.

The copper foil used in the present invention may be either an electrolytic copper foil or a rolled copper foil. A roughening treatment may also be carried out as dictated by the application. The roughening treatment is a step in which fine copper particles are deposited, and is performed prior to the formation of the heat-resistant layer. When high-density wiring is not particularly formed, adhesion to the resin is further enhanced by a roughening treatment. Meanwhile, as to the copper-clad laminate for higher frequency applications, it is preferable for the surface roughness of the copper foil to be as low as possible as mentioned above, and the copper foil of the present invention will have adequate adhesion to an insulating resin even without a roughening treatment. The surface roughness (Rz) of the copper foil should be no more than 4.0 μm, and preferably no more than 3.5 μm, and even more preferably no more than 3.0 μm. To this end, it is important to strike a good balance between roughening particles and undulations on the surface of the copper foil.

As discussed above in the Prior Art section, electrolytic copper foils are widely used for printed wiring boards. In this case, the heat-resistant layer and the olefin-based silane coupling agent layer may be formed on either the S side, which is the drum side in the raw foil step, or on the M side, which is the non-drum side. A heavily textured M side used to be used exclusively as a side to be adhered, but it was found that the surface treated copper foil of the present invention has good adhesive strength with an insulating resin whichever side is used. It is also favorable for an anticorrosive treatment to be performed after the heat resistance treatment, and it is preferable for the opposite side, whichever it may be, to be subject to have an anticorrosive layer.

With the copper foil of the present invention, either the roughened side or the unroughened side is first subjected to a heat resistance treatment. As the heat-resistant layer, at least one type of film selected from a group consisting of zinc, zinc-tin, zinc-nickel, zinc-cobalt, copper-zinc, copper-nickel-cobalt, and nickel-cobalt is preferably formed. Of these, a material containing zinc is preferred, and copper-zinc (brass) is particularly favorable. This heat-resistant layer may also contain a certain amount of other elements, such as manganese, aluminum, iron, nickel, cobalt, or tin.

This film is formed by a known electroplating process, but the method is not limited to electroplating, and vapor deposition or another means may be used as well. When the heat resistance treatment is zinc plating, the methods disclosed in Japanese Patent Publications S61-33907 and H6-81157 can be used. In the case of zinc-nickel or zinc-cobalt, the methods disclosed in Japanese Patent Publications H7-32307 and H6-81157 can be used. When the treatment uses zinc-tin, the method disclosed in Japanese Patent Publication S58-567.58 can be used. Copper-zinc plating involves the use of a cyanide bath or the like and electrodepositing a composition of 50 to 85 wt % copper and 15 to 50 wt % zinc, such as brass of 70 wt % copper and 30 wt % zinc. The effect of the present invention will be realized as long as the thickness of the heat-resistant layer is 100 to 10,000 μg/dm$^2$ as the amount of adhering zinc, furthermore, a range of 1000 to 5500 μg/dm$^2$ is preferable.

Of the above, copper-zinc plating is especially favorable, and the following are typical cyanide bath compositions and electrolysis conditions when a copper foil is plated with copper-zinc.

| | |
|---|---|
| sodium cyanide | 10 to 130 g/L |
| sodium hydroxide | 50 to 70 g/L |
| copper cyanide | 60 to 120 g/L |
| zinc cyanide | 1 to 10 g/L |
| pH | 10 to 13 |
| current density | 1 to 10 A/dm$^2$ |

-continued

| | |
|---|---|
| temperature | 40 to 90° C. |
| duration | 1 to 10 seconds |

It is preferable for the copper foil of the present invention to undergo an anticorrosive treatment after the heat resistance treatment but before the treatment with the silane coupling agent. The anticorrosive treatment preferably involves forming a coating by zinc-chromate or chromate treatment. Any known method to form an anticorrosive layer can be applied to the present invention, but it is preferable to form an anticorrosive layer composed of a chromium oxide produced by dipping or electrolytic chromating, or a mixture of zinc or zinc oxide and a chromium oxide produced by electrolytic chromium/zinc treatment. When a zinc chromate or chromate treatment is performed, the method discussed in Japanese Patent Publication H7-32307 can be used. The amount in which the anticorrosive layer deposits is preferably at least 15 µg/dm$^2$ as the amount of chromium, and when zinc is contained therein, the amount of zinc is at least 30 µg/dm$^2$.

After the above-mentioned heat resistance treatment and anticorrosive treatment, the olefin-based silane coupling agent is spread on the copper foil to form a film thereof. The thickness of this film is 1.0 nm to 10 µm, and preferably 10 nm to 1.0 µm. The coating solution is prepared using water, a weakly acidic aqueous solution, or the like such that the concentration of active components will be 0.001 to 10 wt %, and preferably 0.01 to 6 wt %. There will be little improvement in adhesion at less than 0.001 wt %. On the other hand, exceeding 10 wt % is undesirable because there will no longer be improvement in the effect and solubility will also suffer. The method for coating the copper foil can be spraying the olefin-based silane coupling agent solution with a sprayer, coating with a coater, dipping, casting, and so forth.

Examples of the olefin-based silane coupling agents include vinylsilanes, acrylic silanes, and methacrylic silanes. Vinylsilanes include vinyltrichlorosilane, vinyltrialkoxysilane, and vinyldialkoxyalkylsilanes, such as vinyltrimethoxysilane, vinyltriethoxysilane, vinyltris (β-methoxyethoxy) silane, vinyldimethoxymethylsilane, and vinyldiethoxymethylsilane. Acrylic silanes include γ-acryloxypropyltrimethoxysilane. Methacrylic silanes include γ-methacryloxypropyltrimethoxysilane, γ-methacryloxypropylmethyldimethoxysilane, γ-methacryloxypropylmethyldiethoxysilane, and γ-methacryloxypropyltriethoxysilane. Of these, vinylsilanes are particularly favorable, especially vinyltrimethoxysilane, vinyltriethoxysilane, and so on.

After the copper foil has been coated with the above-mentioned olefin-based silane coupling agent, it is air dried or dried by heating. The water should evaporate enough for the effect of the present invention to be adequately obtained. Moreover, drying at 50 to 180° C. is desirable because the process will accelerate the reaction between the silane coupling agent and the copper foil.

The treatment solutions used for the surface treatment of the copper foil of the present invention can also contain suitable additives as needed, such as other silane coupling agents, pH regulators, and buffers.

A siloxane coating can also be formed on the copper foil of the present invention as a pretreatment to the formation of the olefin-based silane coupling agent layer. Forming a siloxane coating further improves the acid resistance of the copper foil, and also enhances the adhesive strength with the insulating resin.

A method to form a siloxane coating is discussed in detail in Japanese Patent Publication H10-317159. A preferred coating method is to dilute a silicon compound such as a tetraalkoxysilane or a silicate solution to between 0.001 and 20 wt % with a solvent such as water, methanol, ethanol, acetone, ethyl acetate, or toluene, and then, spray this solution onto the copper foil, or dip the copper foil into it. The desired effect will be obtained as long as the treatment temperature is between room temperature and 100° C. Furthermore, an organic compound can be added to a solution of a silicon compound or a silicate in order to increase the peel strength of the copper foil. Acid-washing the copper foil before forming the siloxane coating is also favorable in that it improves the adhesion characteristics.

The insulating resin that will serve as the substrate is laminated with the copper foil of the present invention that has been treated as above. The substrate for higher frequency applications to which the copper foil of the present invention is applied is an insulating resin whose curing system involves double bonds, examples of which include thermosetting polyphenylene ether resins, thermosetting polyphenylene ether resins containing a polystyrene polymer, resin compositions containing a triallyl cyanurate polymer or copolymer, acrylic or methacrylic modified epoxy resin compositions, phenol-added butadiene polymers, diallyl phthalate resins, divinylbenzene resins, polyfunctional methacryloyl resins, unsaturated polyester resins, polybutadiene resins, crosslinked polymers such as styrene-butadiene and styrene-butadiene styrene-butadiene. These resins are not limited to single compounds, and a variety of other substances may be added or the resins may be modified in order to obtain the desired characteristics. A thermoplastic resin may also be blended into the thermosetting resin. Further, the above-mentioned thermosetting resins may contain fillers and additives.

BEST MODE FOR CARRYING OUT THE INVENTION

The present invention will now be described through examples and comparative examples, but the present invention is not limited by these examples.

Examples 1 to 3

A copper foil with a thickness of 18 µm was manufactured by using a revolving drum as a cathode and continuously electrodepositing copper onto this drum through an electrolytic reaction. A roughened side was formed by depositing fine particles of copper on this product (roughening treatment, Rz: 3.0 to 3.5 µm).

A brass plating layer was then formed as the heat-resistant layer over the above-mentioned copper foil under the following conditions. The amount of adhered zinc here was 4500 µg/dm$^2$.

| | |
|---|---|
| sodium cyanide | 10 to 130 g/L |
| sodium hydroxide | 50 to 70 g/L |
| copper cyanide | 60 to 120 g/L |
| zinc cyanide | 1 to 10 g/L |
| pH | 10 to 13 |
| current density | 1 to 10 A/dm$^2$ |
| temperature | 40 to 90° C. |
| duration | 1 to 10 seconds |

Immediately thereafter, the anticorrosive layer was formed through an electrolytic zinc-chromium treatment under the following conditions.

| | |
|---|---|
| K$_2$Cr$_2$O$_7$ | 2 to 10 g/L |
| Zn | 0.2 to 0.5 g/L |
| Na$_2$SO$_4$ | 5 to 20 g/L |
| pH | 3.5 to 5.0 |
| bath temperature | 20 to 40° C. |
| current density | 0.1 to 3.0 A/dm$^2$ |
| duration | 1 to 3 seconds |

In Examples 1 to 3, silane coupling agent layers were formed on the roughened side of the above-mentioned electrolytic copper foil by respectively using the olefin-based silane coupling agents given in ① to ③ below. The surface treatment with these silane coupling agents was accomplished by a method in which a small amount of silane coupling agent solution was dropped onto the copper foil, and an SUS roll was rolled over this to form a coating of the surface treatment agent. After coating, the copper foil was dried for 5 minutes at 100° C.

① A solution obtained by adding vinyltriethoxysilane in an amount of 0.4% to deionized water that had been adjusted to a pH of 5 by the addition of acetic acid, then stirring for 12 hours (0.4% vinyltriethoxysilane, Example 1)

② A solution obtained by adding 3-acryloxypropyltrimethoxysilane in an amount of 0.4% to deionized water that had been adjusted to a pH of 5 by the addition of acetic acid, then stirring for 12 hours (0.4% acryloxypropyltrimethoxysilane, Example 2)

③ A solution obtained by adding 3-methacryloxypropyltrimethoxysilane in an amount of 0.1% to deionized water that had been adjusted to a pH of 5 by the addition of acetic acid, then stirring for 12 hours (0.1% 3-methacryloxypropyltrimethoxysilane, Example 3)

Adhesion Test

The copper foil surface treated as above was hot-pressed with a glass fiber substrate that had been impregnated with a liquid containing polyphenylene ether as a main component, thereby producing a copper-clad laminate. This copper-clad laminate was measured for initial peel strength by the method stipulated in JIS C 6481. The results of this test are given in Table 1 below.

Comparative Examples 1 and 2

In Comparative Examples 1 and 2, a copper foil was produced in the same manner as in Example 1, except that the conditions were changed as below. A copper-clad laminated board was then produced and an adhesion test conducted, in the same manner as in Example 1. These results are also given in Table 1 below.

Comparative Example 1: no olefin-based silane coupling agent layer

Comparative Example 2: no heat-resistant layer (no brass plating layer)

TABLE 1

| | Initial peel strength (kg/cm) |
|---|---|
| Example 1 | 0.50 |
| Example 2 | 0.48 |
| Example 3 | 0.46 |

TABLE 1-continued

| | Initial peel strength (kg/cm) |
|---|---|
| Comparative Example 1 | 0.25 |
| Comparative Example 2 | 0.16 |

As is clear from Table 1, it was confirmed that a copper foil on which the heat-resistant layer and the olefin-based silane coupling agent layer have been formed has excellent adhesion to the insulating resin even when the copper foil has undergone a roughening treatment.

Examples 4 to 11

In Examples 4 to 11, an electrolytic copper foil with a thickness of 35 μm and formed by the same method as in Example 1 was used without a roughening treatment. The heat-resistant layer, anticorrosive layer, and olefin-based silane coupling agent layer listed in Table 2 below were respectively laminated on this copper foil. After each copper foil was coated with a silane coupling agent, the foil was dried for 5 minutes at 100° C. The following olefin-based silane coupling agents were used.

② The same solution as above (0.4% acryloxypropyltrimethoxysilane)

③ The same solution as above (0.1% 3-methacryloxypropyltrimethoxysilane)

④ A solution obtained by adding vinyltriethoxysilane in an amount of 0.6% to deionized water that had been adjusted to a pH of 5 by the addition of acetic acid, then stirring for 12 hours (0.6% vinyltriethoxysilane)

After treatment with a silane coupling agent, the copper foil was hot-pressed with a glass fiber substrate that had been impregnated with a liquid containing polyphenylene ether as a main component, thereby producing a copper-clad laminate. This copper-clad laminate was measured for initial peel strength by the method defined in JIS C 6481. The evaluation results are given in Table 2 below.

Comparative Examples 3 to 6

In Comparative Examples 3 to 6, the same copper foil as in Example 4 was used and subjected to the treatment shown in Table 2. A copper-clad laminate was then produced and the adhesion between the insulating resin and the copper foil was evaluated, in the same manner as in Example 4. The evaluation results are given in Table 2 along with those for the examples. The following silane coupling agents were used and ⑤ below is a silane coupling agent not based on an olefin.

④ The same solution as above (0.6% vinyltriethoxysilane)

⑤ A solution obtained by adding 3-glycidoxypropyltrimethoxysilane in an amount of 0.4% to deionized water that had been adjusted to a pH of 5 by the addition of acetic acid, then stirring for 12 hours (0.4% 3-glycidoxypropyltrimethoxysilane)

TABLE 2

| Treated side | Heat resistance treatment → anticorrosive treatment | Silane coupling agent treatment | Surface roughness of treated side (μm) | Peel strength (kg/cm) |
|---|---|---|---|---|
| Example | | | | |
| 4 | non-drum side | Cu•Zn → Zn•Cr (Zn: 4700 μg/dm$^2$) | ④ | 4.0 | 1.2 |
| 5 | non-drum side | Cu•Zn → Zn•Cr (Zn: 4700 μg/dm$^2$) | ② | 4.0 | 0.8 |
| 6 | non-drum side | Cu•Zn → Zn•Cr (Zn: 4700 μg/dm$^2$) | ③ | 4.0 | 0.8 |
| 7 | non-drum side | Cu•Zn → Zn•Cr (Zn: 1200 μg/dm$^2$) | ④ | 4.0 | 1.0 |
| 8 | non-drum side | Zn•Sn → Zn•Cr (Zn: 500 μg/dm$^2$ Sn: 50 μg/dm$^2$) | ④ | 4.0 | 1.0 |
| 9 | drum side | Cu•Zn → Zn•Cr (Zn: 4700 μg/dm$^2$) | ④ | 1.2 | 0.8 |
| 10 | non-drum side | Cu•Ni•Co → Zn•Cr (Ni: 100 μg/dm$^2$ Co: 1000 μg/dm$^2$) | ④ | 4.0 | 1.0 |
| 11 | non-drum side | Ni•Co → Zn•Cr (Ni: 100 μg/dm$^2$ Co: 1000 μg/dm$^2$) | ④ | 4.0 | 0.9 |
| Comp. Ex. | | | | |
| 3 | non-drum side | none → Zn•Cr (Zn: 50 μg/dm$^2$) | ④ | 4.0 | 0.2 |
| 4 | non-drum side | Cu•Zn → Zn•Cr (Zn: 4700 μg/dm$^2$) | ⑤ | 4.0 | 0.2 |
| 5 | drum side | Cu•Zn → Zn•Cr (Zn: 4700 μg/dm$^2$) | ⑤ | 1.2 | ≦0.1 |
| 6 | non-drum side | Cu•Zn → Zn•Cr (Zn: 4700 μg/dm$^2$) | none | 4.0 | 0.1 |

Examples 12 to 15

A rolled copper foil with a thickness of 35 μm was used, and the heat-resistant layer, anticorrosive layer, and olefin-based silane coupling agent layer listed in Table 3 below were formed on this copper foil surface. After each copper foil was coated with the silane coupling agent, the foil was dried for 5 minutes at 100° C. ④ above (0.6% vinyltriethoxysilane) was used as the olefin-based silane coupling agent. After treatment with the silane coupling agent, the copper foil was hot-pressed with a glass fiber substrate that had been impregnated with a liquid containing polyphenylene ether as a main component (prepreg for copper-clad laminate for higher frequency applications), thereby producing a copper-clad laminate. This copper-clad laminate was measured for initial peel strength by the method stipulated in JIS C 6481. The evaluation results are given in Table 3 below.

Comparative Examples 7 and 8

In Comparative Examples 7 and 8, the copper foil was subjected to the treatment shown in Table 3 in the same manner as in Example 12. A copper-clad laminate was then produced and the adhesion to the insulating resin was evaluated, in the same manner as in Example 12. The evaluation results are given in Table 3 along with those for the examples. The silane coupling agent used in both Comparative Examples 7 and 8 was the non-olefin-based silane coupling agent given in ⑤ above (0.4% 3-glycidoxypropyltrimethoxysilane).

TABLE 3

| | Heat resistance treatment → anticorrosive treatment | Silane coupling agent treatment | Surface roughness of treated side (μm) | Peel strength (kg/cm) |
|---|---|---|---|---|
| Example | | | | |
| 12 | Zn•Ni → dipping chromating (Zn: 250 μg/dm$^2$ Ni: 30 μg/dm$^2$) | ④ | 0.6 | 0.6 |
| 13 | Zn•Ni → dipping chromating (Zn: 1000 μg/dm$^2$ Ni: 50 μg/dm$^2$) | ④ | 0.6 | 0.7 |
| 14 | Zn•Co → dipping chromating (Zn: 250 μg/dm$^2$ Co: 20 μg/dm$^2$) | ④ | 0.6 | 0.5 |
| 15 | Zn → dipping chromating (Zn: 150 μg/dm$^2$) | ④ | 0.6 | 0.4 |
| Comp. Ex. | | | | |
| 7 | Zn•Ni → dipping chromating (Zn: 1000 μg/dm$^2$ Ni: 50 μg/dm$^2$) | ⑤ | 0.6 | ≦0.1 |
| 8 | Zn•Co → dipping chromating (Zn: 250 μg/dm$^2$ Co: 20 μg/dm$^2$) | ⑤ | 0.6 | ≦0.1 |

As is clear from Tables 2 and 3, it was confirmed that the surface-treated copper foil of the present invention exhibits sufficient peel strength even without a roughening treatment, and that this surface treatment is effective at increasing the adhesion between the copper foil and the insulating resin.

Examples 16 to 18

The same copper foil as in Example 1 was used and subjected to the same heat resistance treatment (copper-zinc) and anticorrosive treatment (zinc-chromium), after which the following pretreatment was performed.

Example 16: no pretreatment

Example 17: treatment with 4% sodium disilicate aqueous solution (60° C., shower), following by rinsing with deionized water Example 18: treatment with 0.6% TEOS (tetraethoxysilane) aqueous solution, following by drying After each copper foil had undergone the above pretreatment, it was treated with an olefin-based silane coupling agent. The silane coupling agent was a solution obtained by adding vinyltriethoxysilane in an amount of 0.4% to deionized water that had been adjusted to a pH of 5 by the addition of acetic acid, then stirring for 12 hours (0.4% vinyltriethoxysilane).

Hydrochloric Acid Resistance Evaluation

The following hydrochloric acid resistance evaluation was conducted using the respective copper foils obtained above. First, each copper foil was used to produce a copper-clad laminate in the same manner as in Example 1, and a circuit with a 0.2 mm width was formed on this laminate. This copper-clad laminate was immersed in an 18% hydrochloric acid aqueous solution for 60 minutes at room temperature. Each peel strength before and after immersion was measured by the method defined in JIS C 6481, and the decrease in peel strength was found by comparison of the two values. The decreasing ratios thus obtained are given in Table 4.

TABLE 4

|  | Pretreatment | Decrease |
|---|---|---|
| Example 16 | none | 25% |
| Example 17 | 4% sodium disilicate treatment | 5% |
| Example 18 | 0.6% TEOS treatment | 2% |

It is seen from Table 4 above that adhesion is improved by forming a siloxane coating as a pretreatment prior to the formation of the olefin-based silane coupling agent layer.

INDUSTRIAL APPLICABILITY

As described above, even when the surface-treated copper foil of the present invention does not undergo a roughening treatment, the surface roughness of the copper foil can be lowered for use in a copper-clad laminate for higher frequency applications. Furthermore, even when a resin with a low dielectric constant or dielectric tangent for use with a copper-clad laminate for the applications is used as the resin laminated over this copper foil, the adhesive strength between the copper foil and the resin can still be increased.

The invention claimed is:

1. In a copper-clad laminate used for higher frequency applications and comprising a surface treated copper foil having at least one side in which surface roughening treatment has not been applied and which is laminated to a substrate, the improvement comprising the surface-treated copper foil is formed from a copper foil having at least one side in which surface roughening treatment has not been applied and which is sequentially provided on said at least one side with a heat-resistant layer, an anticorrosive layer and an olefin-based silane coupling agent layer on the at least one side thereof, the heat-resistant layer is at least one film selected from the group consisting of a zinc-tin film, a zinc-nickel film, a zinc-cobalt film, a copper-zinc film and a copper-nickel-cobalt film, the anticorrosive layer is a film formed by a zinc chromate or a chromate treatment, a siloxane coating is formed over the anticorrosive layer, the olefin-based silane coupling agent is provided over the siloxane coating, and the substrate is bonded to the olefin-based silane coupling agent layer and contains an insulating resin having a curing system involving double bonds and selected from the group consisting of thermosetting polyphenylene ether resins, thermosetting polyphenylene ether resins containing a polystyrene polymer, resin compositions containing a triallyl cyanurate polymer or copolymer, acrylic or methacrylic modified epoxy resin compositions, phenol-added butadiene polymers, diallyl phthalate resins, divinylbenzene resins, polyfunctional methacryloyl resins, polybutadiene resins, styrene-butadiene resins and styrene-butadiene-styrene-butadiene resins, wherein the copper foil's at least one side has a surface roughness Rz of no more than 3.5 μm and the insulating resin is cured after the surface-treated copper foil is laminated on the insulating resin.

2. The copper-clad laminate of claim 1, wherein the copper foil is an electrolytic copper foil and the heat-resistant layer, the anticorrosive layer, the olefin-based silane coupling agent layer and the siloxane coating are sequentially provided on an M side and/or S side thereof.

3. The copper-clad laminate of claim 1, wherein the insulating resin having a curing system involving double bonds is a polyphenylene ether resin.

4. The copper-clad laminate of claim 1, wherein the olefin-based silane coupling agent is vinyltriethoxysilane.

5. The copper-clad laminate of claim 1, wherein the heat-resistant layer is a Cu—Zn film, the anticorrosive layer is a Zr—Cr layer, the olefin-based silane coupling agent is vinyltriethoxysilane and the insulating resin having a curing system involving double bonds is a polyphenylene ether resin.

* * * * *